United States Patent [19]

Kanayama

[11] Patent Number: 4,871,968

[45] Date of Patent: Oct. 3, 1989

[54] MAGNETIC RESONANCE APPARATUS

[75] Inventor: Shoichi Kanayama, Yokohama, Japan

[73] Assignee: Kabushiki Kaisha Toshiba, Kawasaki, Japan

[21] Appl. No.: 235,499

[22] Filed: Aug. 24, 1988

[30] Foreign Application Priority Data

Aug. 25, 1987 [JP] Japan .............................. 62-209205

[51] Int. Cl.⁴ ............................................. G01R 33/20
[52] U.S. Cl. .................................................. 324/318
[58] Field of Search ....................... 324/309, 318, 322

[56] References Cited

U.S. PATENT DOCUMENTS 4,820,988 4/1989 Crooks et al. ....................... 324/318

Primary Examiner—Stewart J. Levy
Assistant Examiner—Lawrence G. Fess
Attorney, Agent, or Firm—Oblon, Spivak, McClelland, Maier & Neustadt

[57] ABSTRACT

A magnetic resonance apparatus comprises a main probe coil adapted for transmission and reception of a high frequency to and from a large region of an object under examination or for transmission of the high frequency to the object, a local probe coil formed of a surface coil adapted for transmission and reception of a high frequency to and from a local region corresponding to a local portion of the object or for reception of the high frequency, and a main gradient coil adapted for application of a gradient magnetic field to a large region of the object. The local probe coil is used for measurement of the local region. The magnetic resonance apparatus is further provided with a relatively small-sized local gradient coil for producing a local gradient magnetic field in the sensitive region of the local probe coil and its vicinities only.

14 Claims, 3 Drawing Sheets

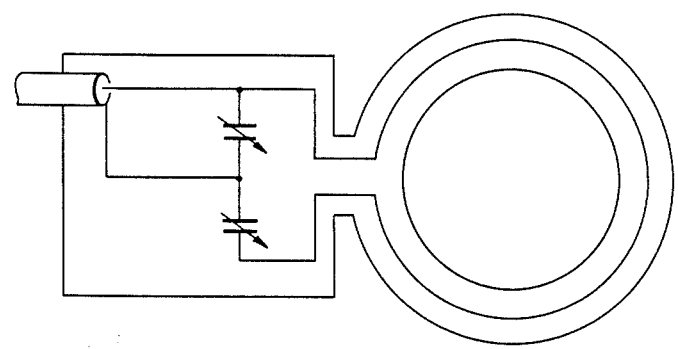
F I G. 1
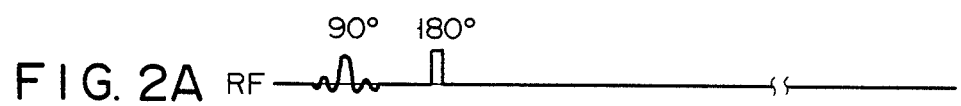
FIG. 2A RF
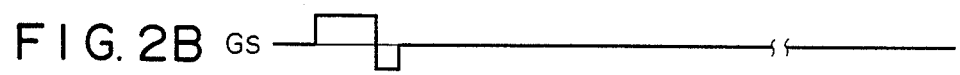
FIG. 2B Gs
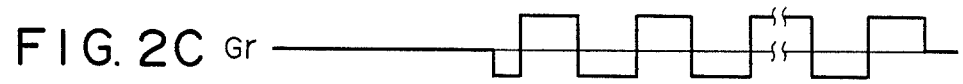
FIG. 2C Gr
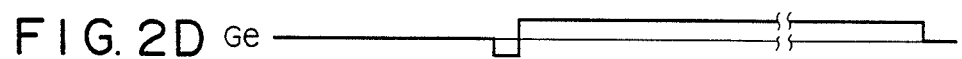
FIG. 2D Ge
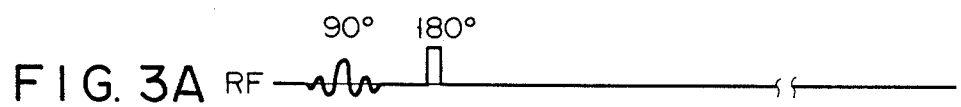
FIG. 3A RF
FIG. 3B Gs
FIG. 3C Gr
FIG. 3D Ge

MAGNETIC RESONANCE APPARATUS

BACKGROUND OF THE INVENTION

1. Field of the Invention

The present invention relates to a magnetic resonance (MR) apparatus, and more particularly, to a magnetic resonance apparatus capable of acquiring magnetic resonance data of an object under examination at a very high speed and at a very high resolution.

2. Description of the Related Art

Magnetic resonance apparatuses chiefly adapted for magnetic resonance imaging generally comprise: a static magnetic field coil system for generating a static magnetic field; a gradient coil system for generating linear gradient fields having strength distributions in mutually orthogonal directions; a high-frequency or radio-frequency (RF) coil system, or a probe coil system for producing a magnetic resonance phenomenon and detecting a magnetic resonance signal produced by the magnetic resonance; a drive circuit for driving the coil systems; and a control and processing device for controlling the drive circuit in a predetermined manner and processing the magnetic resonance signal detected through the high frequency coil system for the purpose of magnetic resonance imaging.

Each of the coil systems is usually comprised of a plurality of coils according to the apparatus scale and the coil geometry. The gradient coil system generates a slice gradient magnetic field Gs for selecting a slice of an object under examination, and encode and readout gradient magnetic fields Ge and Gr for causing two-dimensional position information of a source of magnetic resonance signal in a plane of the slice to be included in the magnetic resonance signal. The encode gradient magnetic field Ge is used at a time of phase encoding of the magnetic resonance signal and the readout gradient magnetic field is used at a time of reading out the magnetic resonance signal. The magnetic resonance signal comes to have position information (information about one direction) due to the encode gradient magnetic field Ge. Likewise, the magnetic resonance signal comes to have position information (information about another direction) due to the readout gradient magnetic field Gr. The control of currents applied to the gradient coil system through the drive circuit by the control and processing circuit will allow the two-dimensional imaging of the specific slice of the object.

The probe coil system adapted for transmitting and receiving the high frequency signal may be set to a suitable shape and size in accordance with the object under examination and/or a portion to be measured. As the probe coil system, a coil system adapted for transmission and reception or a combination of a coil system adapted for transmission only and a coil system adapted for reception only may be used. In particular, in order to image a local portion of the object, such a surface coil as shown in FIG. 1 may be used as the probe coil system, to transmit and receive or receive a high frequency signal.

For local spectroscopy for obtaining a magnetic resonance spectrum of a local portion of an object under examination, the depth resolved surface coil spectroscopy (DRESS) method has been proposed which combines the surface coil and the selective excitation method.

As high-speed imaging methods for acquiring magnetic resonance data at high speed the echo planar method and the fast Fourier method have been proposed. An example of the timing diagram of high frequency pulse RF, slice gradient field Gs, readout gradient field Gr, and encode gradient field Ge in the pulse sequence of the echo planar method is shown in FIGS. 2A–2D. Further, an example of the timing diagram of high frequency pulse RF, slice gradient pulse Gs, readout gradient pulse Gr and encode gradient pulse Ge in the pulse sequence of the fast Fourier method is shown in FIGS. 3A–3D.

In existing magnetic resonance apparatus, gradient coils apply gradient fields to the entire body of an object or a considerable proportion of the body irrespective of the size of a portion to be measured. For this reason it is necessary to always supply the gradient coils with large currents. However, in the case of imaging of a local portion, it is not practically necessary for the gradient coils to apply gradient fields to a large proportion of the body. As long as the gradient fields exist only within the sensitive range of the probe coil, the imaging is not at all affected. On the other hand, the imaging of a local region corresponding to a local portion at high speed and high resolution requires gradient magnetic fields of very great amplitude. Further, the gradient fields must be switched quickly. However, with the existing gradient coil systems, the coils themselves are large in size and their inductance is large. Therefore, even if a special power supply for gradient fields is used, it is not easy to provide gradient fields of sufficiently great amplitude, and it is not possible to obtain switching characteristics which allow sufficiently quick switching of gradient fields. Further, to image a local region at high speed and high resolution, an operation for selecting the region to be imaged should be made rapid and easy.

SUMMARY OF THE INVENTION

It is accordingly an object of the present invention to provide a magnetic resonance apparatus which permits the imaging of a local region of an object under examination at a high speed and at a high resolution.

A magnetic resonance apparatus of the present invention comprises a main probe coil system adapted for transmission and reception of a high frequency to and from a large region of an object under examination or for transmission of the high frequency to the object, a local probe coil system formed of, for example, a surface coil adapted for transmission and reception of a high frequency to a local region corresponding to a local portion of the object or for reception of the high frequency, and a main gradient coil system adapted for application of a gradient magnetic field to the large region of the object. The local probe coil is used for measurement of the local region. The magnetic resonance apparatus is further provided with a relatively small-sized local gradient coil system for producing a local gradient magnetic field in the sensitive region of the local probe coil and its vicinities only. A very fast and high-resolution measurement of magnetic resonance is made possible without the need of a special power supply for the gradient magnetic field because the gradient magnetic field produced by the local gradient coil has a greater strength for each unit current than by the main gradient coil, and the local gradient coil has a smaller inductance than by the main gradient coil. Further, by properly combining the local probe coil system as a receiver, and the sequences for the selective excitation or the selective saturation utilizing the main probe coil system as a transmitter, it becomes possible to quickly perform the selection of the local region of the object.

According to the magnetic resonance apparatus of the present invention, because of provision of a small-sized local gradient coil system, very fast and very high-resolution measurement of a local portion of an object is made possible. As a result, high-resolution local imaging of moving portions such as the heart and the blood vessels will be made possible. In addition, where the local gradient coil system and the local probe coil system are integrated into a unit, and a plurality of units are used simultaneously, simultaneous local multiplane imaging will be made possible. Moreover, very fast and high-resolution multislice photographing of a local region will be made possible.

BRIEF DESCRIPTION OF THE DRAWINGS

FIG. 1 is a schematic view of a surface coil;

FIGS. 2A–2D show, by way of example, a timing diagram of the pulse sequence used in the echo planar method for high-speed imaging;

FIGS. 3A–3D show, by way of example, a timing diagram of the pulse sequence used in the fast Fourier method for high-speed imaging;

DETAILED DESCRIPTION OF THE PREFERRED EMBODIMENTS

Figure 4:
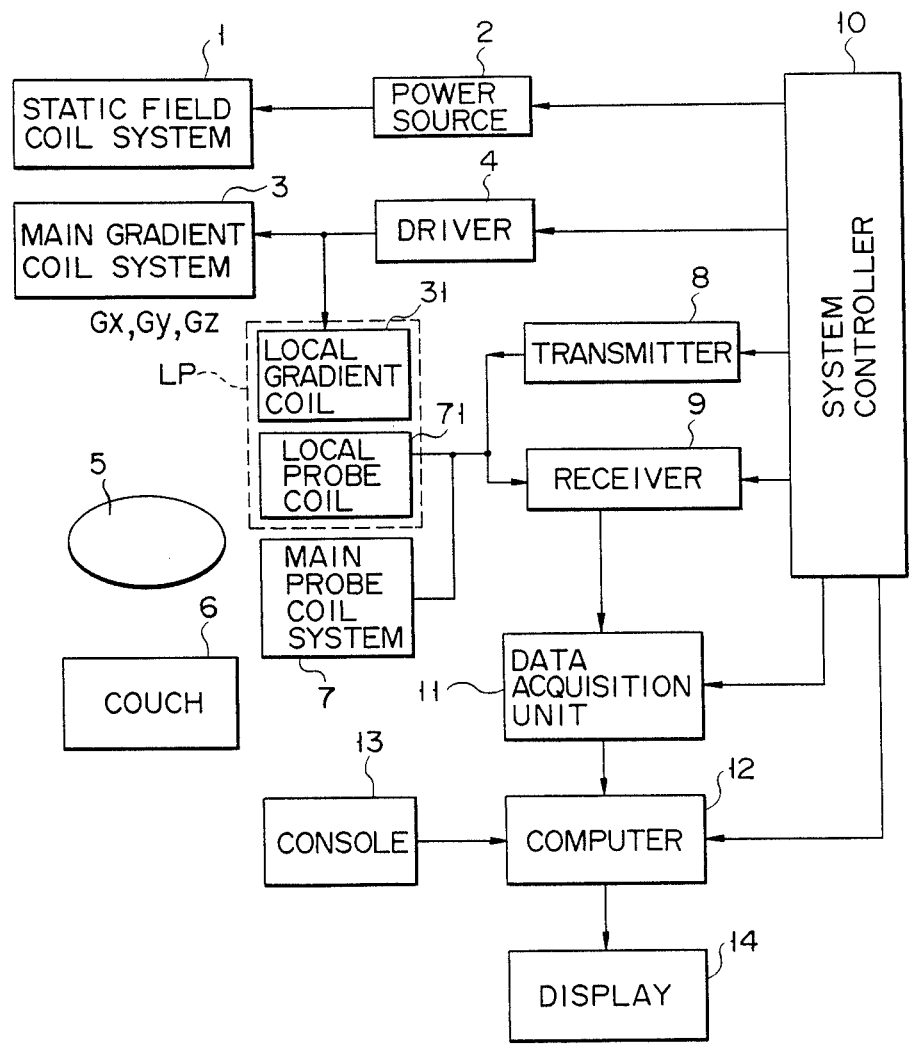
FIG. 4 is a block diagram of a magnetic resonance apparatus embodying the present invention.

Referring now to FIG. 4, a magnetic resonance apparatus embodying the invention comprises a static coil system 1, an power source 2, a main gradient coil system 3, a local gradient coil system 31, a driver circuit 4, a couch or examination table 6, a main probe coil system 7, a local probe coil system 71, a transmitter 8, a receiver 9, a system controller 10, a data acquisition unit 11, a computer 12, a console 13 and a display 14.

Static field coil system 1 is driven by power source 2 to produce a homogeneous static magnetic field. Main gradient coil system 3 is driven by driver circuit 4 to produce main gradient fields Gx and Gy in two orthogonal directions in a desired plane of interest, i.e., x and y directions, and another main gradient field Gz in the z direction normal to the x and y directions. The main gradient fields Gx, Gy and Gz each have strength which varies linearly. Local gradient coil system 31 is also driven by driver circuit 4 to produce a gradient field locally. The static magnetic field produced by static field coil system 1 and the main gradient magnetic fields Gx, Gy and Gz produced by main gradient field coil system 3 are applied to an object under examination (for example, a human body) placed on couch 6. The local gradient field produced by local gradient coil system 31 of small size is superimposed upon the static field and the main gradient fields Gx, Gy and Gz. The above-mentioned slice gradient field, encode gradient field and readout gradient field are formed by at least part of the main gradient fields Gx, Gy and Gz and the local gradient field. Power source 2 and driver circuit 4 are controlled by system controller 10.

Object 5 is further subjected to a high-frequency magnetic field which is produced by main probe coil system 7 and/or local probe coil system 71 responsive to a high-frequency signal provided from transmitter 8 under the control of system controller 10. In the present embodiment, main probe coil system 7 and/or local probe coil system 71 is a transmission/reception coil system which is commonly used as a transmission coil system adapted to generate a high frequency magnetic field and as a reception coil system adapted to receive a magnetic resonance signal relating to specific atomic nuclei within object 5. Alternatively, the transmitter coil system and the receiver coil system may be provided separately.

The magnetic resonance signal received by main probe coil system 7 and/or local probe coil system 71 is amplified and detected in receiver 9 and then fed to data acquisition section 11 under the control of system controller 10. Being subjected to analog-to-digital conversion in data acquisition unit 11, the magnetic resonance signal is applied to computer 12.

Computer 12, operated by an operator through console 13, executes a predetermined signal process, e.g., a Fourier transform process, the magnetic resonance signal provided from data acquisition unit 11 to obtain magnetic resonance information relating to specific atomic nuclei. Computer 12 also controls system controller 10. The magnetic resonance information of specific atomic nuclei finally provided from computer 12 is applied to display 14 so as to display a magnetic resonance image or a magnetic resonance spectrum.

Figure 5:
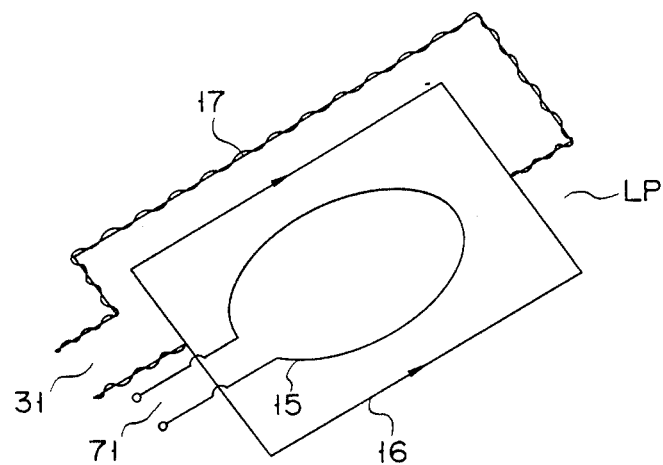
FIG. 5 is a schematic view of a probe coil with a gradient coil used in the apparatus of FIG. 4.
Figure 6:
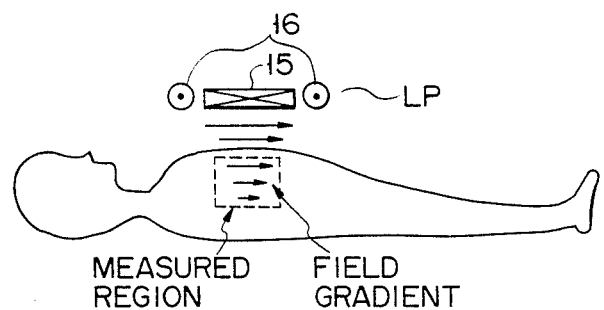
FIG. 6 shows a distribution of gradient magnetic fields produced by the probe coil of FIG. 5.

Local gradient coil system 31 and local probe coil system 71 of FIG. 4 may be integrated into an integrated local probe LP as shown in FIG. 5. Conductors are disposed around surface coil 15 constituting local probe coil system 71 in such a way that they are parallel to the coil plane of surface coil 15 and currents flow in the same direction, thereby forming local gradient coil 16 constituting local gradient coil system 31. By currents flowing through local gradient coil 16, a gradient field having a field strength distribution in which the field strength varies in the direction normal to surface coil 15 can be produced in a local region as shown in FIG. 6. A return portion of local gradient coil 16, that is, a feeding line to local gradient coil 16 that is parallel to coil 16 is formed of an inductionless wire 17 so as to eliminate the influence of a magnetic field which may otherwise be produced by a conductor of the return portion.

The sequence of the echo planar method as shown in FIGS. 2A–2D can be carried out by using local gradient coil 16 provided in integrated local probe LP. That is, local gradient coil 16 may be used as the gradient coil for producing the readout gradient field Gr used in reading out a magnetic resonance signal, and main gradient coil system 3 may be used as the gradient coil for producing the slice gradient field Gs to determine a slice at a time of excitation of magnetic resonance and the encode gradient field Ge for phase-encoding. In this case, main gradient coil 3 produces field gradients in mutually orthogonal directions parallel to the plane of local probe LP.

The sequence in the fast Fourier method as shown in FIGS. 3A–3D also can be carried out by the use of integrated local probe LP. That is, local gradient coil 16 in local probe LP may be used as the local coil for producing the readout gradient field Gr, and main gradient coil system 3 may be used as the gradient coil for producing the slice gradient field Gs and the encode gradient field Ge. In this case as well, main gradient coil 3 produces field gradients in mutually orthogonal directions parallel to the plane of local probe LP.

By using small-sized local gradient coil system 31 in local probe LP as the gradient field coil for producing the read gradient field Gr, the field strength per unit drive current in a local region can be increased and the spatial resolution can be enhanced. In addition, since the inductance of the readout gradient coil becomes small, the readout gradient field can be switched quickly. As a result, the very fast and high-resolution imaging of a local region can be realized.

Figure 7:
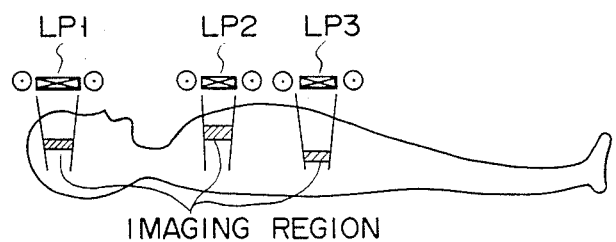
FIG. 7 is a diagram useful for explaining the simultaneous local multiplane imaging using a plurality of probe coils of FIG. 5.

By using a plurality of local probes LP1, LP2, LP3 . . . at the same time as shown in FIG. 7 it is possible to perform the simultaneous local multiplane imaging.

As with the DRESS method described above, if the local probe is applied to the sequence of the selective excitation or selective saturation, then the number of times of the selection of a region by the excitation sequence will be reduced and hence the selection of the region will be performed rapidly because the region excited by the probe itself is restricted. Moreover, by combining the selective excitation or selective saturation sequence using the local probe with a very fast imaging sequence as in the echo planar method or the fast Fourier method, the imaging of a local region can be carried out more quickly. The local multislice or local multiplane imaging can also be performed instantly.

Of course, main probe coil system 7 and local probe coil system 71 may be combined for use. That is, main probe coil system 7 may be used to induce magnetic resonance, and local probe coil system 71 may be used to read a magnetic resonance signal. Conversely, local probe coil system 71 may be used to induce magnetic resonance, and main probe coils system 7 may be used to read a magnetic resonance signal.

Although the preferred embodiment of the present invention has been disclosed and described, it is apparent that other embodiments and modifications are possible.

For example, in the above embodiment, the direction of the field gradient resulting from the small-sized local gradient coil is normal to the probe plane. Alternatively, the direction of the field gradient may be set as desired by disposing the local gradient coil properly.

In addition, where only measurement of magnetic resonance information for a local region is aimed at, the main probe coil system may be omitted, in which case only the local probe coil is used for transmission and reception of a high frequency signal.

Moreover, the local gradient coil and the local probe may be provided separately without being integrated.

What is claimed is:

1. A magnetic resonance apparatus comprising:
   static magnetic field producing means for producing a homogeneous static magnetic field which is applied to an object under examination;
   main gradient magnetic field producing means for producing a gradient magnetic field covering a relatively large region, which is superimposed upon the static magnetic field for application to the object;
   local gradient magnetic field producing means for producing a local gradient magnetic field which is superimposed upon the static magnetic field for application to the object;
   main probe means for applying a high frequency magnetic field to a relatively large region of the object and detecting a magnetic resonance signal produced within the region of the object;
   local probe means magnetically coupled to only a local region of the object for performing at least one of first and second operations, the first operation applying a high frequency magnetic field to the local region of the object and the second operation detecting a magnetic resonance signal produced in the local region of the object;
   system control means for controlling said static magnetic field producing means, said main gradient magnetic field producing means, said local gradient magnetic field producing means, said main probe means, and said local probe means in a predetermined pulse sequence; and
   processing means for controlling said system control means and processing the magnetic resonance signal detected by one of said main probe means and said local probe means to obtain output information.

2. A magnetic resonance apparatus according to claim 1, wherein said local gradient magnetic field producing means and said local probe means are integrated into a unit.

3. A magnetic resonance apparatus according to claim 1, wherein said local probe means includes a surface coil.

4. A magnetic resonance apparatus according to claim 1, wherein said local gradient magnetic field producing means and said local probe means are integrated, and said local probe means includes a surface coil.

5. A magnetic resonance apparatus according to claim 4, wherein said local gradient magnetic field producing means produces a field gradient in a direction orthogonal to said surface coil.

6. A magnetic resonance apparatus according to claim 2, wherein there are provided a plurality of integrated units of said local gradient magnetic field producing means and said local probe means.

7. A magnetic resonance apparatus according to claim 1, wherein said main gradient magnetic field producing means includes coil means, and said local gradient magnetic field producing means includes coil means smaller than that of said main gradient magnetic field producing means.

8. A magnetic resonance apparatus comprising:
   static magnetic field producing means for producing a homogeneous static magnetic field for application to an object under examination;
   main gradient magnetic field producing means for producing a gradient magnetic field covering a relatively large region, which is superimposed upon the static magnetic field for application to the object;
   local gradient magnetic field producing means for producing a local gradient magnetic field which is superimposed upon the static magnetic field for application to the object;
   local probe means for applying a high frequency magnetic field to only a local region of the object and detecting a magnetic resonance signal produced in the local region of the object;
   system control means for controlling said static magnetic field producing means, said main gradient magnetic field producing means, said local gradient magnetic field producing means, and said local probe means in a predetermined pulse sequence; and processing means for controlling said system control means and processing the magnetic resonance signal detected by said local probe means to obtain output information.

9. A magnetic resonance apparatus according to claim 8, wherein said local gradient magnetic field producing means and said local probe means are integrated into a unit.

10. A magnetic resonance apparatus according to claim 8, wherein said local probe means includes a surface coil.

11. A magnetic resonance apparatus according to claim 8, wherein said local gradient magnetic field producing means and said local probe means are integrated, and said local probe means includes a surface coil.

12. A magnetic resonance apparatus according to claim 11, wherein said local gradient magnetic field producing means produces a field gradient in a direction orthogonal to said surface coil.

13. A magnetic resonance apparatus according to claim 9, wherein there are provided a plurality of integrated units of said local gradient magnetic field producing means and said local probe means.

14. A magnetic resonance apparatus according to claim 9, wherein said main gradient magnetic field producing means includes coil means, and said local gradient magnetic field producing means includes coil means smaller than that of said main gradient magnetic field producing means.

* * * * *